United States Patent
Mito et al.

(10) Patent No.: US 9,459,293 B2
(45) Date of Patent: Oct. 4, 2016

(54) CURRENT SENSOR

(71) Applicant: YOKOGAWA ELECTRIC CORPORATION, Musashino-shi, Tokyo (JP)

(72) Inventors: Shinya Mito, Musashino (JP); Kazuma Takenaka, Musashino (JP); Satoshi Kato, Musashino (JP)

(73) Assignee: YOKOGAWA ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/328,748

(22) Filed: Jul. 11, 2014

(65) Prior Publication Data
US 2015/0022199 A1  Jan. 22, 2015

(30) Foreign Application Priority Data

Jul. 16, 2013 (JP) .................. 2013-147732
Jan. 21, 2014 (JP) .................. 2014-008274

(51) Int. Cl.
*G01R 19/00* (2006.01)
*G01R 33/09* (2006.01)
*G01R 15/20* (2006.01)

(52) U.S. Cl.
CPC ......... *G01R 19/0092* (2013.01); *G01R 15/207* (2013.01); *G01R 33/091* (2013.01); *G01R 15/205* (2013.01)

(58) Field of Classification Search
CPC .................. G01R 19/00; G11B 5/33
USPC .................................................. 324/252
See application file for complete search history.

(56) References Cited

U.S. PATENT DOCUMENTS

| 2003/0151406 A1 | 8/2003 | Wan et al. | |
| 2006/0291106 A1* | 12/2006 | Shoji | G01R 33/09 360/324.11 |
| 2007/0170533 A1* | 7/2007 | Doogue | B82Y 25/00 257/422 |
| 2011/0227560 A1 | 9/2011 | Haratani et al. | |
| 2013/0257581 A1* | 10/2013 | Koike | G01R 33/093 338/32 R |

FOREIGN PATENT DOCUMENTS

| DE | 255214 A1 | 3/1988 |
| JP | 3-14467 U | 2/1991 |
| JP | 3-282368 A | 12/1991 |
| JP | 11-237411 A | 8/1999 |
| JP | 2000-55999 A | 2/2000 |
| JP | 2002303642 A | 10/2002 |
| JP | 2007107972 A | 4/2007 |
| JP | 2008-122083 A | 5/2008 |
| JP | 2012-225818 A | 11/2012 |

* cited by examiner

*Primary Examiner* — Tung X Nguyen
*Assistant Examiner* — Zannatul Ferdous
(74) *Attorney, Agent, or Firm* — Hauptman Ham, LLP

(57) ABSTRACT

A current sensor includes: four magnetic sensor elements arranged within a plane orthogonal to a measured current, having a symmetrical magnetic characteristics curve, and adapted to convert a magnitude of a magnetic field into an electrical signal and output the electrical signal; a bridge circuit including the four magnetic sensor elements; and a bias magnetic field application member adapted to applying a bias magnetic field to the magnetic sensor elements.

13 Claims, 11 Drawing Sheets

CURRENT SENSOR

CROSS-REFERENCE TO RELATED APPLICATION

This application claims priority from Japanese Patent Application Nos. 2013-147732 filed with the Japan Patent Office on Jul. 16, 2013 and 2014-008274 filed with the Japan Patent Office on Jan. 21, 2014, the entire contents of which are hereby incorporated by reference.

BACKGROUND

1. Technical Field

The present disclosure relates to a current sensor using magnetic sensor elements.

2. Related Art

As a type of current sensor, current sensors using magnetic sensor elements have been known. The magnetic sensor element converts a magnitude of a magnetic field into an electric signal based on the change in the electric resistance, the electromotive force, or the like and outputs the electric signal.

In detecting the magnitude of the current flowing in a cable in a contactless manner, a measurement error may be caused when the relative position between the center of the cable and the current sensor is shifted.

Therefore, for reducing the displacement-caused error in the current sensor, it is proposed to use a magnetism collection core or a plurality of magnetic sensor elements.

It is noted that the displacement-caused error refers to a measurement error that occurs when there is a shift in the relative position between the current sensor and the cable in which the measured current flows.

Further, the magnetism collection core refers to the one that is formed by soft-magnetic metal having a high permeability and has much effect of collecting the magnetic flux.

FIG. 17 is a schematic diagram illustrating an example of the arrangement of the conventional current sensor with a magnetism collection core (JP 2002-303642 A). As illustrated in FIG. 17, in the case where a magnetism collection core 1 is used, a hole element 2 measures the magnetic flux along the magnetism collection core 1. Thus, even when the position of a cable 3 is shifted within the magnetism collection core 1, the amount of the measured magnetic flux does not change substantially. As a result, substantially no measurement error occurs.

When the magnetism collection core is used, however, the measurement accuracy may be deteriorated because of a displacement of the magnetism collection core due to the vibration, rust of the magnetism collection core, deterioration of the characteristics of the magnetism collection core due to a temperature change, and/or deterioration of the linearity and/or the hysteresis characteristics of the sensor due to the magnetism collection core, for example. Moreover, the magnetism collection core is used under a magnetically unsaturated state, which requires a larger size of the magnetism collection core. This results in an increased size of the sensor.

FIG. 18 is a schematic diagram illustrating an example of the arrangement of the conventional current sensor that has a plurality of hole elements arranged around the cable (JP 2007-107972 A). As illustrated in FIG. 18, a plurality of hole elements 4 are arranged on the circumference of a substrate 6 centering around a cable 5. The hole elements neighboring to each other on the circumference are electrically connected in series.

In this arrangement, the outputs of respective hole elements 4 change due to the relative displacement between the cable 5 and the current sensor. These changes cancel the change in the sum of the outputs of the hole elements 4. Even when the position of the cable 5 is shifted, the sum of the outputs of all the hole elements 4 does not change substantially. Therefore, substantially no measurement error occurs.

SUMMARY

A current sensor includes: four magnetic sensor elements arranged within a plane orthogonal to a measured current, having a symmetrical magnetic characteristics curve, and adapted to convert a magnitude of a magnetic field into an electrical signal and output the electrical signal; a bridge circuit including the four magnetic sensor elements; and a bias magnetic field application member adapted to applying a bias magnetic field to the magnetic sensor elements.

DETAILED DESCRIPTION

Figure 1:
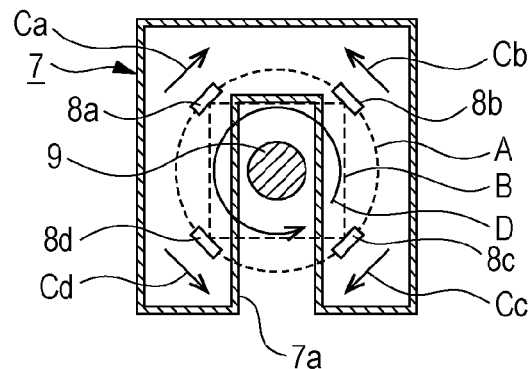
FIG. 1 is a schematic diagram illustrating an arrangement of one example of a current sensor based on one embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 18:
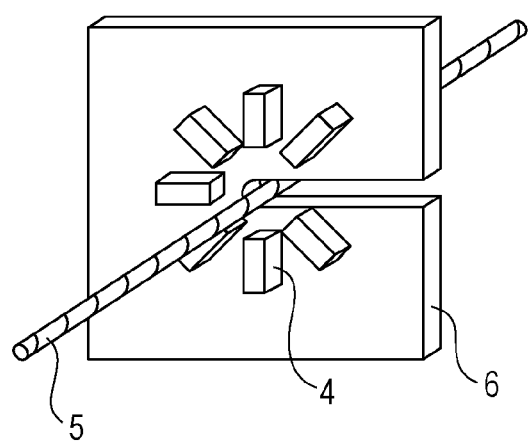
FIG. 18 is a schematic diagram illustrating an arrangement of an example of the conventional current sensor having a plurality of hole elements arranged around a cable.

In the conventional arrangement illustrated in FIG. 18, the sensitivities of the hole elements 4 are relatively low, which results in a low sensitivity as a current sensor. In order to increase the sensitivity as a current sensor as much as possible, it can be considered to use more elements. In this case, however, the size of the current sensor will increase, which results in the increase in the number of parts and the cost.

One of the purposes of the present disclosure is to achieve a current sensor using magnetic sensor elements that consumes less power, has a high sensitivity property, has a compact and simple arrangement, is able to reduce a displacement-caused error, and is relatively inexpensive.

A current sensor according to a first embodiment of the present disclosure includes: four magnetic sensor elements arranged within a plane orthogonal to a measured current, having a symmetrical magnetic characteristics curve, and adapted to convert a magnitude of a magnetic field into an electrical signal and output the electrical signal; a bridge circuit including the four magnetic sensor elements; and a bias magnetic field application member adapted to applying a bias magnetic field to the magnetic sensor elements.

A current sensor according to a second embodiment of the present disclosure is the current sensor according to the first embodiment, wherein the magnetic sensor elements are magneto-resistance elements electric resistances of which change in response to application of a magnetic field.

A current sensor according to a third embodiment is the current sensor according to the first embodiment, wherein the magnetic sensor elements are magneto-impedance elements electric impedances of which change in response to application of a magnetic field.

A current sensor according to a fourth embodiment is the current sensor according to any one of the first to third embodiments, wherein the bias magnetic field application member includes a permanent magnet.

A current sensor according to a fifth embodiment is the current sensor according to any one of the first to fourth embodiments, and further has a sensor substrate made of a non-magnetic material on which the magnetic sensor elements are mounted.

A current sensor according to a sixth embodiment is the current sensor according to the fifth embodiment, wherein the magnetic sensor elements are mounted on one surface of the sensor substrate and the bias magnetic field application member is arranged on the other surface of the sensor substrate.

A current sensor according to a seventh embodiment is the current sensor according to the sixth embodiment, and further has an attachment member made of a magnetic material for attaching the bias magnetic field application member to the sensor substrate.

A current sensor according to an eighth embodiment is the current sensor according to any one of the first to seventh embodiments, wherein the bias magnetic field application member is arranged so that its magnetic pole direction is parallel to a magnetic sensitive direction exhibiting a maximum sensitivity of the magnetic sensor elements.

A current sensor according to a ninth embodiment is the current sensor according to any one of the first to eighth embodiments, wherein the bridge circuit is arranged so that a cable in which a measured current flows is located therein.

The above features allow for the current sensor that consumes less power, has a high sensitivity property, has a compact and simple arrangement, is able to reduce the displacement-caused error, and is relatively inexpensive.

Figure 2:
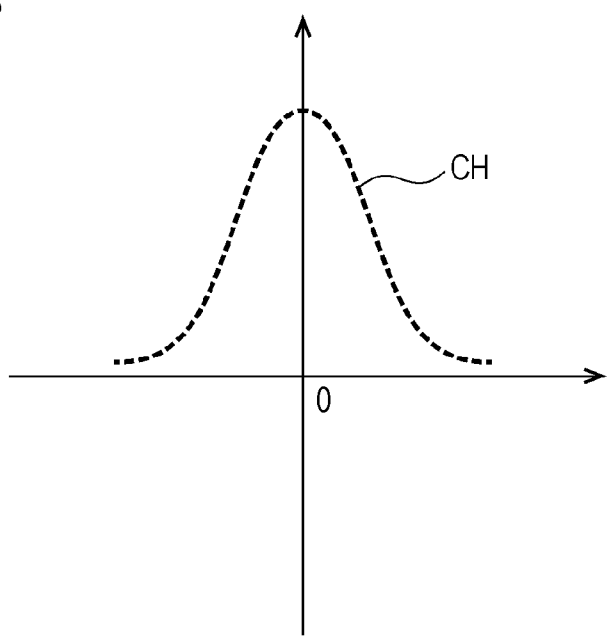
FIG. 2 is a schematic diagram of an axially symmetrical magnetic characteristics curve CH.
Figure 3:
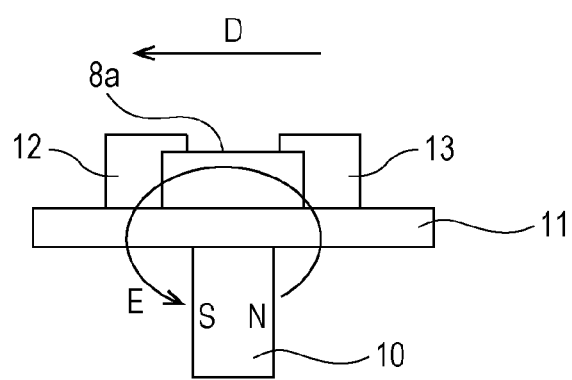
FIG. 3 is a partial enlarged view of FIG. 1.

One embodiment of the present disclosure will be described in detail below by using the drawings. FIG. 1 is a schematic diagram illustrating an arrangement of one example of a current sensor based on one embodiment of the present disclosure. As illustrated in FIG. 1, this example has a substrate 7 and four magnetic sensor elements 8a to 8d. The magnetic sensor elements 8a to 8d are attached to one surface of the substrate 7 so as to have a predetermined positional relationship. The magnetic sensor elements 8a to 8d have an axially symmetrical magnetic characteristics curve CH as illustrated in FIG. 2. Further, the substrate 7 is provided with a cut groove 7a. A cable 9 having a circular cross section and in which a measured current flows is inserted in the cut groove 7a. It is noted that this example has a sensor substrate 11 on which the magnetic sensor elements 8a to 8d are mounted as illustrated in FIG. 3 (illustration of the sensor substrate 11 is omitted in FIG. 1). It is noted that, of the magnetic sensor elements 8a to 8d, the magnetic sensor element 8a only is illustrated in FIG. 3.

The substrate 7 is set with respect to the cable 9 so that the surface of the substrate 7 makes a plane orthogonal to the measured current flowing in the cable 9. The four magnetic sensor elements 8a to 8d are arranged on the circumference of a circle A having a predetermined radius indicated by a broken line centering around the cable 9. The magnetic sensor elements 8a to 8d are arranged so that their magnetic sensitive directions exhibiting the maximum sensitivity are directed in a tangent of the circle A and that the magnetic sensor elements 8a to 8d are located at each vertex of a square B inscribing the circle A.

To the four magnetic sensor elements 8a to 8d, bias magnetic fields are applied in the directions of arrows Ca to Cd by a permanent magnet 10 (a bias magnetic field application member), respectively, as illustrated in FIG. 3. The permanent magnet 10 may be provided to each of the four magnetic sensor elements 8a to 8d. The permanent magnet 10 is arranged on the other surface of the substrate 7. The directions of the bias magnetic fields applied to the magnetic sensor elements 8a to 8d neighboring to each other along the circumference of the circle A are opposite to each other along the circumference of the circle A. It is noted that the circle A represents the magnetic sensitive direction of respective magnetic sensor elements 8a to 8d. A circle D indicated by a solid line represents the direction of the magnetic field generated by the measured current that flows in the cable 9.

FIG. 3 is a partial enlarged view of FIG. 1. As illustrated in FIG. 3, the magnetic sensor elements 8a to 8d are mounted on one surface of the sensor substrate 11. In addition, the permanent magnet 10 is arranged on the other surface of the sensor substrate 11. The permanent magnet 10 is arranged so that its magnetic pole direction is parallel to the magnetic sensitive direction of the magnetic sensor elements $8a$ to $8d$. The optimum magnitude of the bias magnetic field can be applied to the magnetic sensor elements $8a$ to $8d$ by properly adjusting the distance between the permanent magnet 10 and the magnetic sensor elements $8a$ to $8d$ by using the sensor substrate 11 made of a non-magnetic material. It is noted that cable pads 12 and 13 are attached to both ends of the magnetic sensor element 8, respectively. Further, an ellipse E represents a magnetic flux by the permanent magnet 10.

Figure 4A:
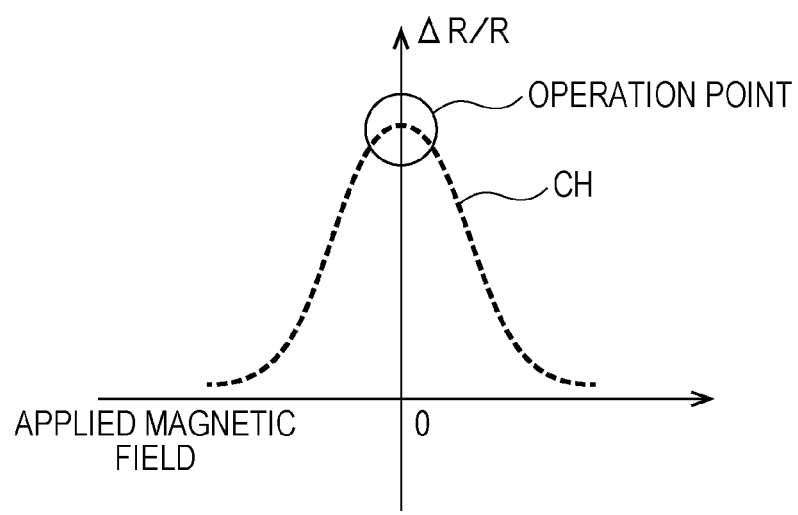
FIG. 4A and FIG. 4B are schematic diagrams of a bias magnetic field.
Figure 4B:
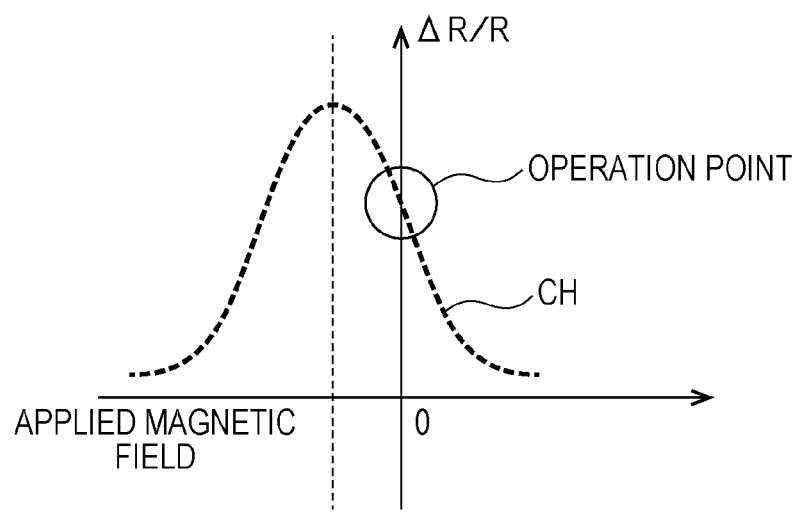

FIG. 4A and FIG. 4B are schematic diagrams of the bias magnetic field. FIG. 4A is a magnetic characteristics curve CH in the case with no bias magnetic field. FIG. 4B is a magnetic characteristics curve CH in the case with a bias magnetic field. In the case with no bias magnetic field, the operation point is assumed to be at the maximum value of the magnetic characteristics curve CH, as illustrated in FIG. 4A. In this case, as illustrated in FIG. 4B, the operation point can be moved to any point on the magnetic characteristics curve CH by applying the bias magnetic field.

Figure 5:
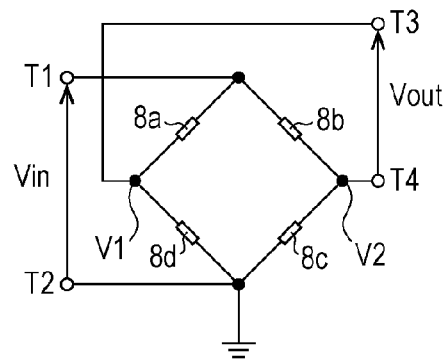
FIG. 5 is an example circuit diagram of the current sensor based on one embodiment of the present disclosure.

FIG. 5 is an example of the circuit of the current sensor based on one embodiment of the present disclosure. As illustrated in FIG. 5, the magnetic sensor elements $8a$ to $8d$ neighboring to each other along the circumference of the circle A of FIG. 1 are electrically connected. Thereby, a bridge circuit is formed. This bridge circuit is arranged so that the cable 9 in which the measured current flows is located therein, as illustrated in FIG. 1.

As illustrated in FIG. 5, one end of the magnetic sensor element $8a$ is connected to an input terminal T1 and connected to one end of the magnetic sensor element $8b$. The other end of the magnetic sensor element $8a$ is connected to an output terminal T3 and connected to the other end of the magnetic sensor element $8d$. The other end of the magnetic sensor element $8b$ is connected to an output terminal T4 and connected to the other end of the magnetic sensor element $8c$. One end of the magnetic sensor element $8c$ is connected to an input terminal T2 and connected to one end of the magnetic sensor element $8d$. The input terminal T2 is connected to a common potential point.

According to the circuit arrangement of FIG. 5, an intermediate potential V1 at the connection point of the magnetic sensor element $8a$ and the magnetic sensor element $8d$ is outputted to the output terminal T3. An intermediate potential V2 at the connection point of the magnetic sensor element $8b$ and the magnetic sensor element $8c$ is outputted to the output terminal T4.

Figure 6:
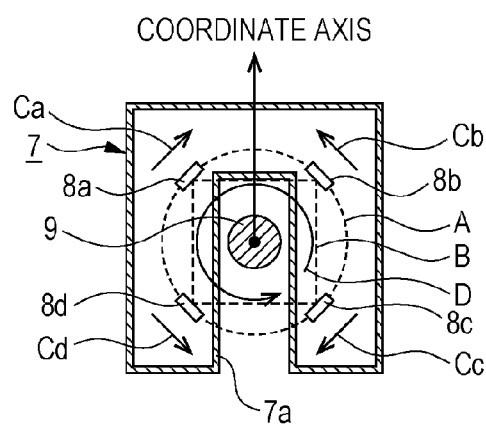
FIG. 6 is a schematic diagram illustrating an arrangement of another example of the current sensor based on one embodiment of the present disclosure.

FIG. 6 is a schematic diagram illustrating an arrangement of another example of the current sensor based on one embodiment of the present disclosure. In FIG. 6, a coordinate axis used for the measurement of the displacement-caused error is added to the example of FIG. 1.

Figure 7:
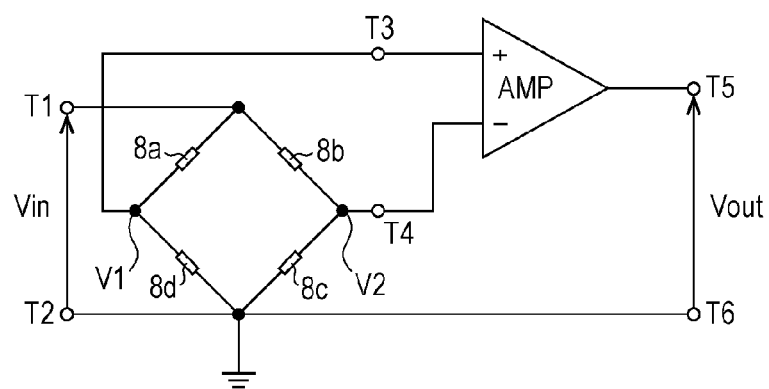
FIG. 7 is an example circuit diagram of the current sensor based on one embodiment of the present disclosure used in a measurement of a displacement-caused error.

FIG. 7 is an example of the circuit of the current sensor based on one embodiment of the present disclosure used for the measurement of the displacement-caused error. In FIG. 7, the same reference numerals are provided to the parts common to FIG. 5. As illustrated in FIG. 7, the output terminal T3 of the bridge circuit is connected to a non-inverting input terminal of an instrumentation amplifier AMP including a plurality of operational amplifiers. The output terminal T4 is connected to an inverting input terminal of the instrumentation amplifier AMP.

The output terminal of the instrumentation amplifier AMP is connected to an output terminal T5 of the entire device (the current sensor). The input terminal T2 is connected to the connection point of the magnetic sensor element $8c$ and the magnetic sensor element $8d$ and to the common potential point. Further, the input terminal T2 is connected to an output terminal T6 of the entire device.

In the arrangement illustrated in FIG. 6 and FIG. 7, in response that a current flows in the cable 9, the magnetic characteristics of the four magnetic sensor elements $8a$ to $8d$ change according to the magnitude of the current and the direction of the bias magnetic field. This results in the change in the magnitude of the voltage drop in each of the magnetic sensor elements $8a$ to $8d$ constituting the bridge circuit. According to the above change in the magnitude of the voltage drop, the intermediate potential V1 and the intermediate potential V2 of the bridge circuit change in the opposite polarities. Assuming that all the characteristics of respective magnetic sensor elements $8a$ to $8d$ are the same, the output voltage of the bridge circuit is fourfold compared to the case where the measurement was made by one magnetic sensor element.

Considered will be the case where there is a shift in the relative position of the current sensor based on one embodiment of the present disclosure and the cable 9. When the relative position of the current sensor and the cable 9 is shifted, the change in the magnetic characteristics decreases in the magnetic sensor element of the magnetic sensor elements $8a$ to $8d$ which has an increasing distance from the cable 9. On the other hand, the change in the magnetic characteristics increases in the magnetic sensor element which has the decreasing distance. In the current sensor based on one embodiment of the present disclosure, the bias magnetic field is being applied in a predetermined direction. This causes the intermediate potential V1 and the intermediate potential V2 of the bridge circuit to change in the direction of the same polarity even when the cable 9 is shifted in any direction within the same plane as the substrate. Therefore, the output voltage of the bridge circuit does not change substantially.

Figure 8:
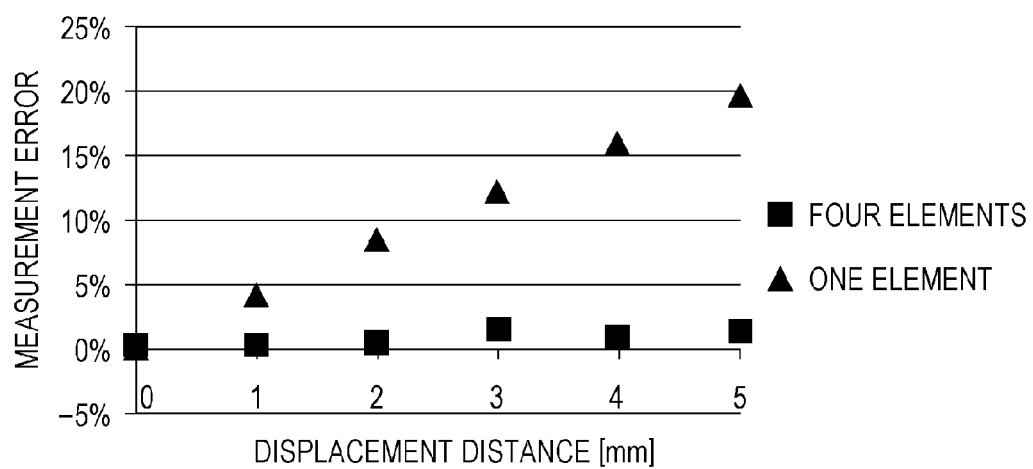
FIG. 8 is a diagram illustrating an example of the measurement result of the error due to a relative displacement between the current sensor having the circuit arrangement of FIG. 7 and a cable.

FIG. 8 is an example of the measurement result of the error (the displacement-caused error) due to the relative displacement between the current sensor and the cable 9 according to the circuit arrangement of FIG. 7. In FIG. 8, the horizontal axis represents the distance of the relative displacement between the cable 9 and the current sensor, and the vertical axis represents the magnitude of the measurement error. In this measurement, a magneto-resistance element containing a nano-granular film and a soft-magnetic thin film was used for the magnetic sensor elements $8a$ to $8d$. The direct distance between the neighboring magnetic sensor elements $8a$ to $8d$ was set to 23 mm. The output voltage of the instrumentation amplifier AMP was measured.

According to the measurement result of FIG. 8, the measurement error of the current sensor based on one embodiment of the present disclosure is 1.5% or less even in the case where the relative position of the current sensor and the cable 9 is shifted by 5 mm. On the other hand, in the case where measurement is made by one magnetic sensor element, the shift of 5 mm in the relative position results in the measurement error of 19.8%.

Accordingly, it is clear that, in the current sensor based on one embodiment of the present disclosure, the measurement error in the case where the relative position between the current sensor and the cable 9 is shifted by 5 mm is reduced to $1/13$ compared to in the conventional current sensor. That is, the current sensor based on one embodiment of the present disclosure has an advantage of the reduction in the displacement-caused error.

Considered will be the case where an even magnetic field such as the terrestrial magnetism is applied to the current sensor based on one embodiment of the present disclosure. In this case, the magnetic characteristics of the four magnetic sensor elements 8a to 8d change according to the magnitude of the magnetic field and the bias magnetic field direction. Within the bridge circuit, there are changes in the magnitude of the voltage drop in respective magnetic sensor elements 8a to 8d. These changes in the magnitude of the voltage drop cause the intermediate potential V1 and the intermediate potential V2 illustrated in FIG. 5 to change in the same polarity direction and by the same magnitude. Therefore, substantially no change occurs in the output voltage of the bridge circuit.

Further, in the current sensor based on one embodiment of the present disclosure, the change in the ambient temperature causes the change in the magnetic characteristics of the magnetic sensor elements 8a to 8d. In this case, the magnetic characteristics of all the magnetic sensor elements 8a to 8d change in the same direction. Therefore, the intermediate potential V1 and the intermediate potential V2 illustrated in FIG. 5 change in the same direction in the polarity. Thus, substantially no offset due to the temperature change occurs in the output voltage of the bridge circuit.

It is noted that, in the above-described example, the magneto-resistance element containing the nano-granular film and the soft-magnetic film is used as the example of the magnetic sensor elements 8a to 8d. The magnetic sensor elements 8a to 8d are not limited to the above, but may be a magneto-resistance element such as an anisotropic magneto-resistance element (AMR), a giant magneto-resistance element (GMR), and a tunnel magneto-resistance element (TMR), in which the electric resistance changes in response to the application of the magnetic field. Furthermore, the magnetic sensor elements 8a to 8d may be, for example, a magneto-impedance element made of an amorphous wire or a thin film of a soft-magnetic material in which the electric impedance changes in response to the application of the magnetic field.

Further, the permanent magnet 10 may be a samarium cobalt magnet the main component of which is samarium and cobalt. Furthermore, the permanent magnet 10 may be, for example, a neodymium magnet the main component of which is neodymium, iron and boron, a ferrite magnet the main component of which is iron oxide, an alnico magnet the main component of which is aluminum, nickel, cobalt, and iron, and a magnet the main component of which is iron, chrome, and cobalt.

Further, in the above-described example, the approach of applying the bias magnetic field to the magnetic sensor elements 8a to 8d by the permanent magnet 10 has been described. With respect to the application of the bias magnetic field, a predetermined magnitude of the bias magnetic field may be applied in the magnetic sensitive direction of the magnetic sensor elements 8a to 8d. The position and the number of the permanent magnet are not limited to the above example.

Figure 9:
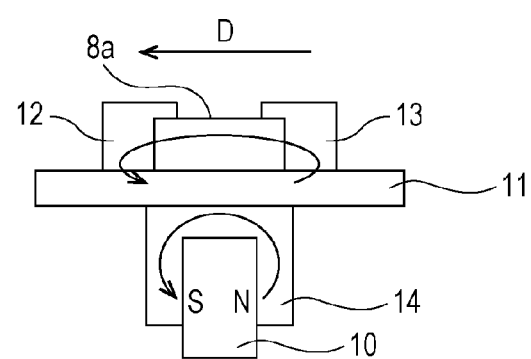
FIG. 9 is a schematic diagram illustrating an arrangement of another example of the current sensor based on one embodiment of the present disclosure.

In the example of FIG. 3, the intensity of the used bias magnetic field was around 20 Oe. Therefore, the permanent magnet 10 is directly attached to the non-magnetic sensor substrate 11. In the case where the low bias magnetic field of a few Oe is applied, the permanent magnet 10 may be attached to the non-magnetic sensor substrate 11 via a soft-magnetic structure (an attachment member) 14 made of a soft-magnetic material, as illustrated in FIG. 9. In the example of FIG. 9, at least a part of the both magnetic pole surfaces of the permanent magnet 10 is covered with the soft-magnetic structure 14. This causes the bias magnetic field to be applied while the both magnetic pole surfaces are connected. It is noted that, of the magnetic sensor elements 8a to 8d, the magnetic sensor element 8a only is illustrated in FIG. 9.

Figure 10A:
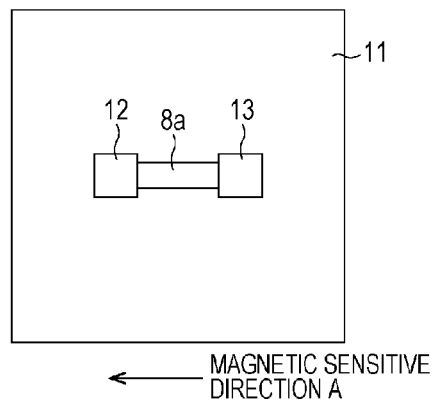
FIG. 10A to FIG. 10F are schematic diagrams illustrating arrangements of other examples of one embodiment of the present disclosure.
Figure 10D:
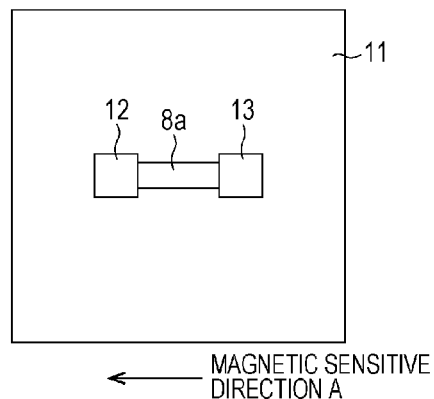
Figure 10B:
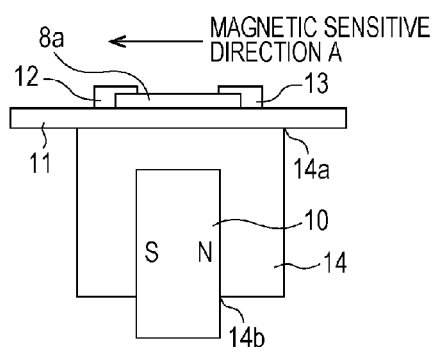
Figure 10E:
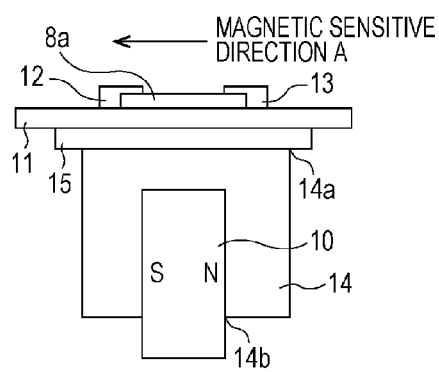
Figure 10C:
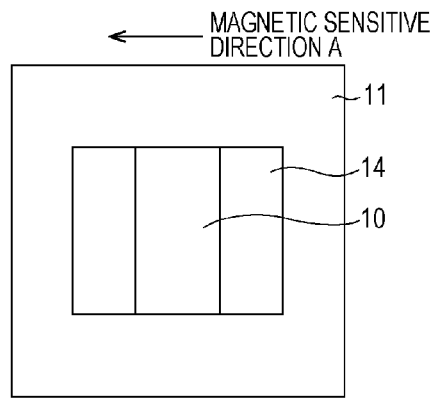
Figure 10F:
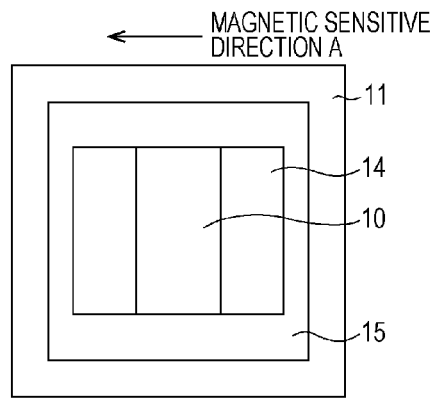

FIG. 10A to FIG. 10F are also schematic diagrams illustrating arrangements of other examples according to one embodiment of the present disclosure. The example illustrated in FIG. 10A to FIG. 10C is the arrangement provided with no non-magnetic spacer. FIG. 10A is the top view of this example. FIG. 10B is the side view of this example. FIG. 10C is the bottom view of this example. The example illustrated in FIG. 10D to FIG. 10F is the arrangement provided with a non-magnetic spacer. FIG. 10D is the top view of this example. FIG. 10E is the side view of this example. FIG. 10F is the bottom view of this example.

As illustrated in FIG. 10B, the magnetic sensor elements (magnetic sensitive elements) 8a to 8d are arranged on one surface (the top surface) of the sensor substrate 11 made of the non-magnetic material so that their magnetic pole directions are parallel to the magnetic sensitive direction A. It is noted that, of the magnetic sensor elements 8a to 8d, the magnetic sensor element 8a only is illustrated in FIG. 10A to FIG. 10F. The cable pads 12 and 13 are provided to both ends of the magnetic sensor elements 8a to 8d. On the other surface (the under surface) of the sensor substrate 11, fixed is a connection part 14a of the soft-magnetic structure 14 formed in a U-shape. A part of both magnetic pole surfaces of the permanent magnet 10 is engaged in an opening 14b of the soft-magnetic structure 14 so that the direction of the magnetic fields of both magnetic poles of the permanent magnet (bulk magnet) 10 is the same as and thus parallel to the magnetic sensitive direction A.

As illustrated in FIG. 10E, a spacer 15 made of a non-magnetic material may be provided between the sensor substrate 11 and the connection part 14a of the soft-magnetic structure 14.

It is here assumed that the magnetic sensor elements (magnetic sensitive elements) 8a to 8d have the output characteristics that is axially symmetry to the applied magnetic field. The permanent magnet 10 functions to apply the bias magnetic field to the magnetic sensor elements 8a to 8d. The soft-magnetic structure 14 covers at least a part of both magnetic pole surfaces of the permanent magnet 10. This allows the soft-magnetic structure 14 to function to connect both magnetic pole surfaces of the permanent magnet 10.

Figure 11A:
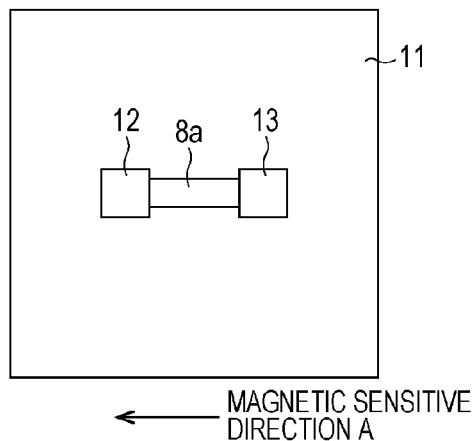
FIG. 11A to FIG. 11F are schematic diagrams illustrating arrangements of other examples of one embodiment of the present disclosure.
Figure 11D:
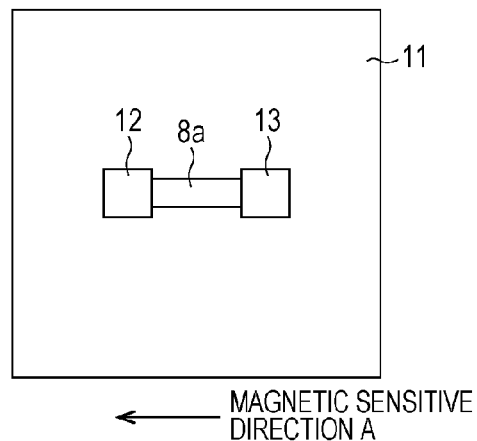
Figure 11B:
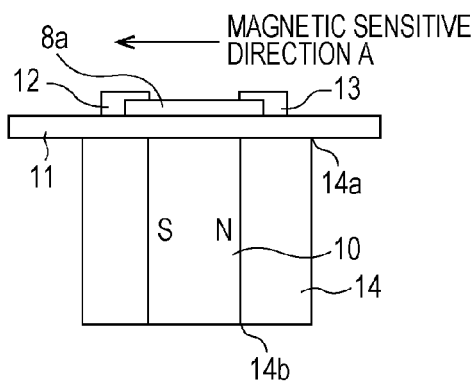
Figure 11E:
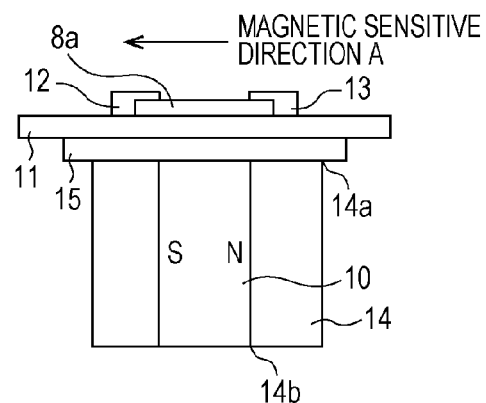
Figure 11C:
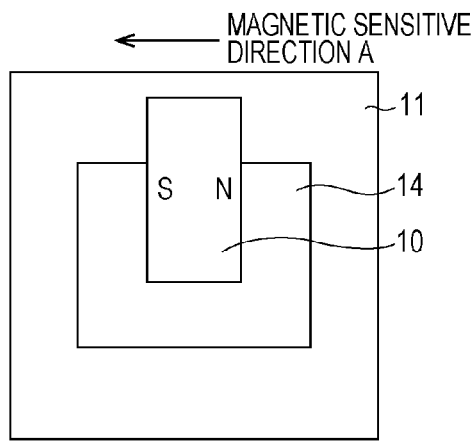
Figure 11F:
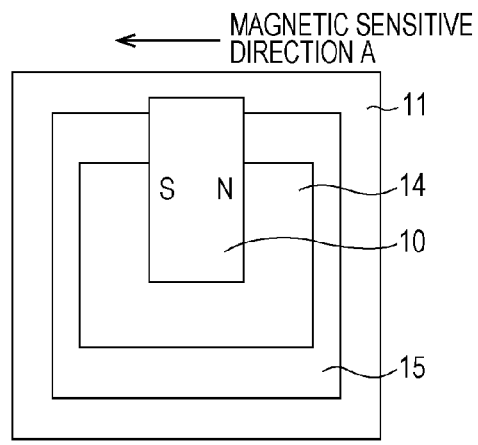

FIG. 11A to FIG. 11F are also schematic diagrams illustrating arrangements of other examples according to one embodiment of the present disclosure. The example illustrated in FIG. 11A to FIG. 11C is the arrangement provided with no non-magnetic spacer. FIG. 11A is the top view of this example. FIG. 11B is the side view of this example. FIG. 11C is the bottom view of this example. The example illustrated in FIG. 11D to FIG. 11F is the arrangement provided with a non-magnetic spacer. FIG. 11D is the top view of this example. FIG. 11E is the side view of this example. FIG. 11F is the bottom view of this example.

As illustrated in FIG. 11B, the magnetic sensor elements 8a to 8d are arranged on one surface (the top surface) of the sensor substrate 11 made of the non-magnetic material so that their magnetic pole directions are parallel to the magnetic sensitive direction A. It is noted that, of the magnetic sensor elements 8a to 8d, the magnetic sensor element 8a only is illustrated in FIG. 11A to FIG. 11F. The cable pads 12 and 13 are provided to both ends of the magnetic sensor elements 8a to 8d. On the other surface (the under surface) of the sensor substrate 11, fixed is one side surface section adjacent to the connection part 14a of the soft-magnetic structure 14 formed in a U-shape. The soft-magnetic structure 14 of this example is in such a state that it is rotated by 90 degrees from the state of FIG. 10B. A part of both magnetic pole surfaces of the permanent magnet 10 is engaged in the opening 14b of the soft-magnetic structure 14 so that the direction of the magnetic fields of both magnetic poles of the permanent magnet 10 is maintained to be the same as and thus parallel to the magnetic sensitive direction A.

As illustrated in FIG. 11E, the spacer 15 made of a non-magnetic material may be provided between the sensor substrate 11 and the connection part 14a of the soft-magnetic structure 14.

Figure 12A:
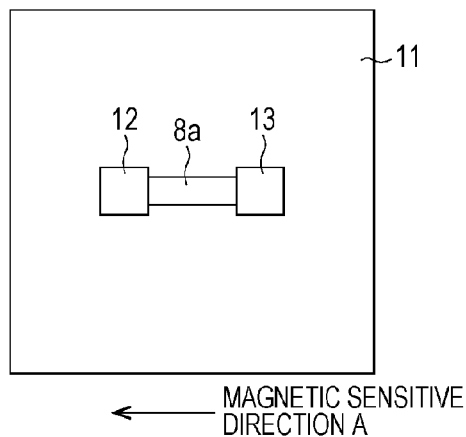
FIG. 12A to FIG. 12F are schematic diagrams illustrating arrangements of other examples of one embodiment of the present disclosure.
Figure 12D:
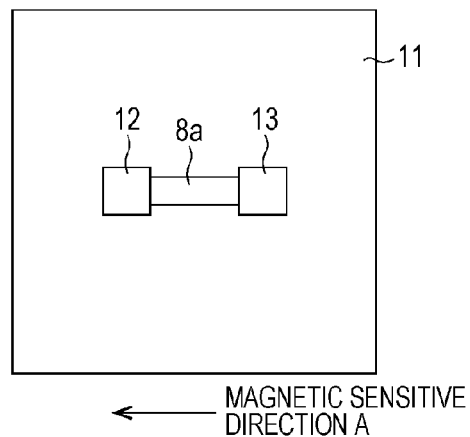
Figure 12B:
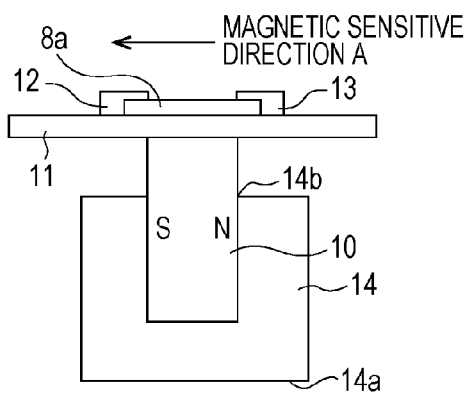
Figure 12E:
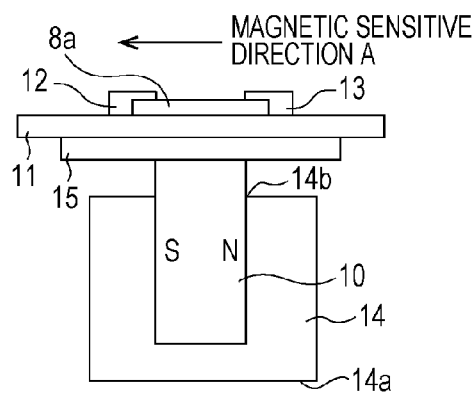
Figure 12C:
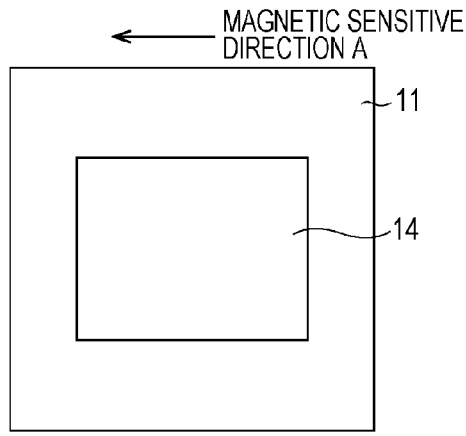
Figure 12F:
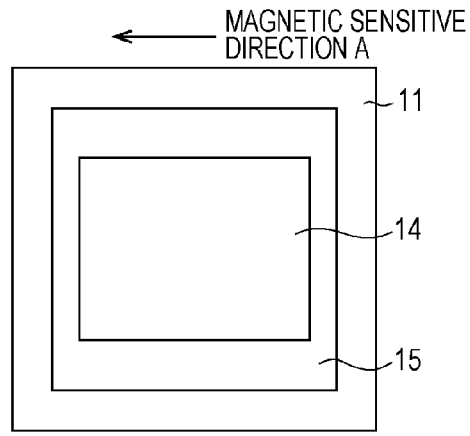

FIG. 12A to FIG. 12F are also schematic diagrams illustrating arrangements of other examples according to one embodiment of the present disclosure. The example illustrated in FIG. 12A to FIG. 12C is the arrangement provided with no non-magnetic spacer. FIG. 12A is the top view of this example. FIG. 12B is the side view of this example. FIG. 12C is the bottom view of this example. The example illustrated in FIG. 12D to FIG. 12F is the arrangement provided with a non-magnetic spacer. FIG. 12D is the top view of this example. FIG. 12E is the side view of this example. FIG. 12F is the bottom view of this example.

As illustrated in FIG. 12B, the magnetic sensor elements 8a to 8d are arranged on one surface (the top surface) of the sensor substrate 11 made of the non-magnetic material so that their magnetic pole directions are parallel to the magnetic sensitive direction A. It is noted that, of the magnetic sensor elements 8a to 8d, the magnetic sensor element 8a only is illustrated in FIG. 12A to FIG. 12F. The cable pads 12 and 13 are provided to both ends of the magnetic sensor elements 8a to 8d. On the other surface (the under surface) of the sensor substrate 11, the end surface of the permanent magnet 10 is fixed so that both magnetic poles of the permanent magnet 10 are maintained to be in the same magnetic field direction as and thus parallel to the magnetic sensitive direction A. In this example, the soft-magnetic structure 14 is in such a state that it is rotated by 180 degrees from the state of FIG. 10B. The connection part 14a of the soft-magnetic structure 14 exposes itself as the bottom surface.

As illustrated in FIG. 12E, the spacer 15 made of a non-magnetic material may be provided between the sensor substrate 11 and the opening 14b of the soft-magnetic structure 14.

Figure 13A:
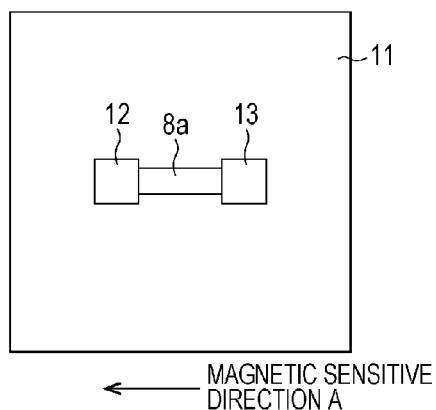
FIG. 13A to FIG. 13F are schematic diagrams illustrating arrangements of other examples of one embodiment of the present disclosure.
Figure 13D:
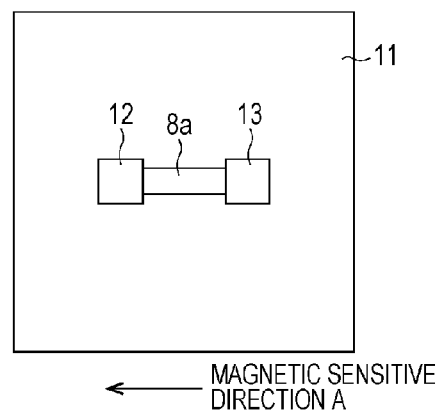
Figure 13B:
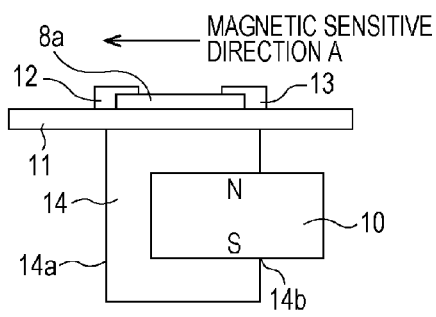
Figure 13E:
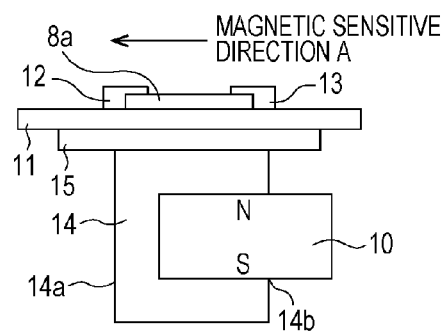
Figure 13C:
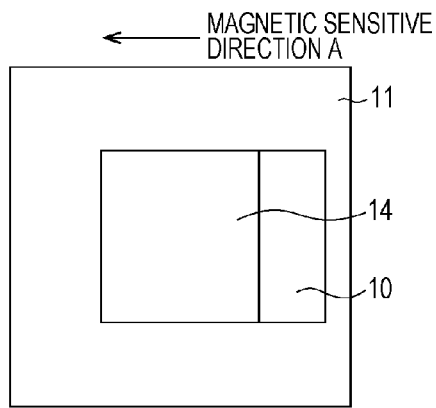
Figure 13F:
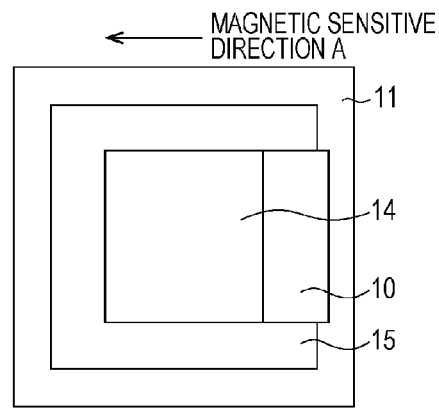
Figure 14A:
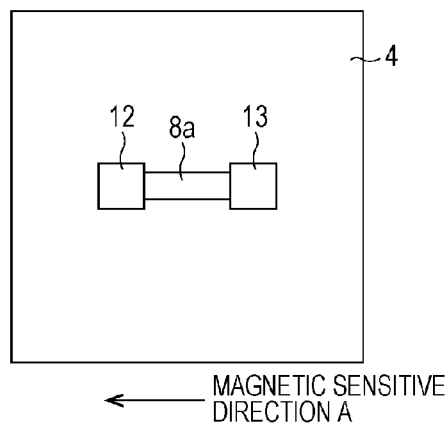
FIG. 14A to FIG. 14F are schematic diagrams illustrating arrangements of other examples of one embodiment of the present disclosure.
Figure 14D:
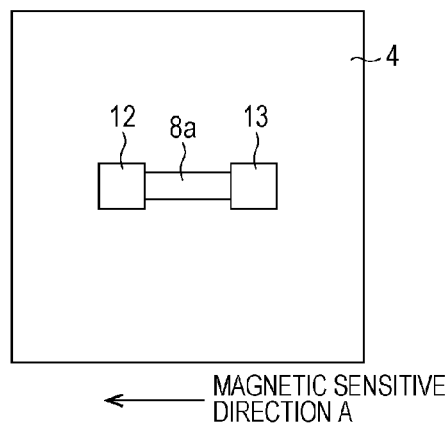
Figure 14B:
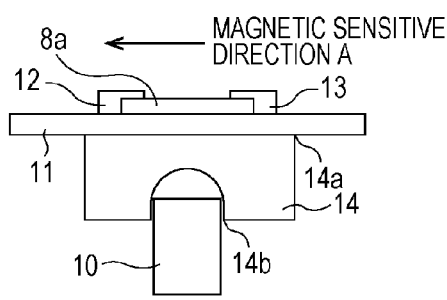
Figure 14E:
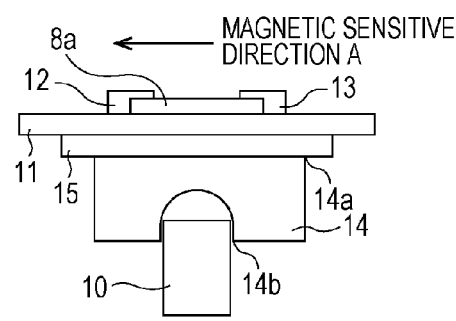
Figure 14C:
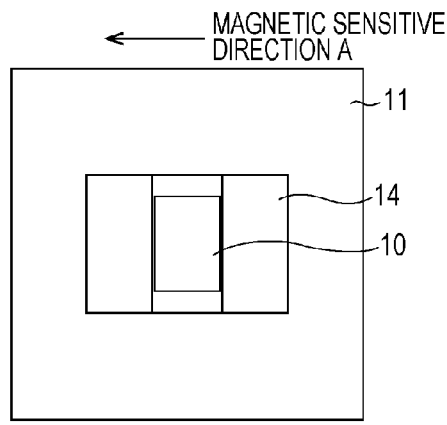
Figure 14F:
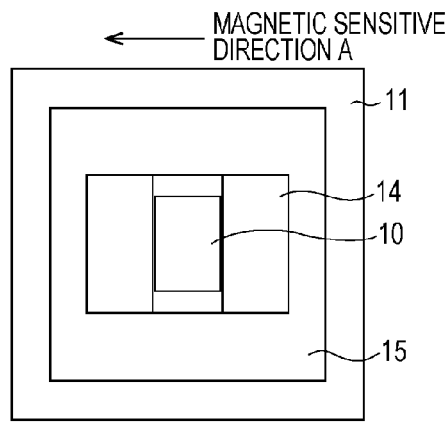

FIG. 13A to FIG. 13F are also schematic diagrams illustrating arrangements of other examples according to one embodiment of the present disclosure. The example illustrated in FIG. 13A to FIG. 13C is the arrangement provided with no non-magnetic spacer. FIG. 13A is the top view of this example. FIG. 13B is the side view of this example. FIG. 13C is the bottom view of this example. The example illustrated in FIG. 13D to FIG. 13F is the arrangement provided with a non-magnetic spacer. FIG. 13D is the top view of this example. FIG. 13E is the side view of this example. FIG. 13F is the bottom view of this example.

As illustrated in FIG. 13B, the magnetic sensor elements 8a to 8d are arranged on one surface (the top surface) of the sensor substrate 11 made of the non-magnetic material so that their magnetic pole directions are parallel to the magnetic sensitive direction A. It is noted that, of the magnetic sensor elements 8a to 8d, the magnetic sensor element 8a only is illustrated in FIG. 13A to FIG. 13F. The cable pads 12 and 13 are provided to both ends of the magnetic sensor elements 8a to 8d. On the other surface (the under surface) of the sensor substrate 11, the soft-magnetic structure 14 formed in a U-shape is arranged. A part of both magnetic pole surfaces of the permanent magnet 10 is engaged in the opening 14b of the soft-magnetic structure 14 so that the direction of the magnetic fields of both magnetic poles of the permanent magnet 10 is orthogonal to the magnetic sensitive direction A. In this example, the soft-magnetic structure 14 is in such a state that it is rotated by 90 degrees in the anti-clockwise direction from the state of FIG. 10B.

As illustrated in FIG. 13E, the spacer 15 made of a non-magnetic material may be provided between the sensor substrate 11 and the soft-magnetic structure 14.

The arrangement of the permanent magnet 10 and the soft-magnetic structure 14 is different among these arrangements of FIGS. 10A to 10F to FIGS. 13A to 13F. Therefore, the intensities of the magnetic fields applied to the magnetic sensor elements 8a to 8d are different, respectively. In these arrangement, the bias magnetic field that is weaker than the magnetic field of the case with a single permanent magnet 10 (the case without the soft-magnetic structure 14) is applied to the magnetic sensor elements 8a to 8d.

FIG. 14A to FIG. 14F are schematic diagrams illustrating the arrangement of a magnetism detection device for confirming the effect of the non-magnetic spacer 15. It is noted that a tunnel magneto-resistance element containing a nano-granular film and a soft-magnetic thin film is used for the magnetic sensor elements 8a to 8d. For the non-magnetic spacer 15, a quartz plate of 0.5 mm in thickness is used. Further, the thickness of the sensor substrate 11 on which the magnetic sensor elements 8 are formed is also 0.5 mm.

Figure 15:
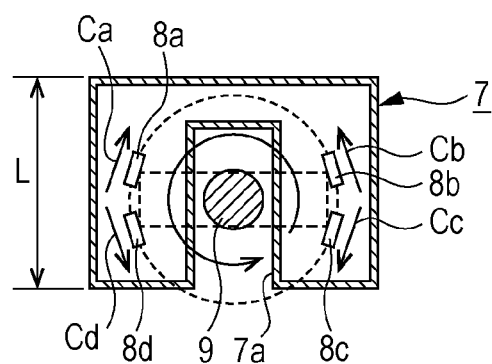
FIG. 15 is a schematic diagram illustrating an arrangement of another example of one embodiment of the present disclosure.

FIG. 15 is also a schematic diagram illustrating the arrangement of another example according to one embodiment of the present disclosure. In this example, the substrate 7 of the current sensor is reduced in the longitudinal direction of the cut groove 7a in the example illustrated in FIG. 1. In FIG. 15, the same reference numerals are provided to the parts common to FIG. 1. As illustrated in FIG. 15, on the substrate 7, four magnetic sensor elements 8a to 8d are arranged on the circumference of the circle centering around the cable 9 in which the measured current flows. The magnetic sensor elements 8a to 8d are arranged so that their magnetic sensitive directions are directed to the tangent of the circle and that the magnetic sensor elements 8a to 8d are located at each vertex of the rectangle inscribing the circle centering the cable 9 while a longitudinal direction of the cut groove 7a is used as a short side. In this example, the application of the bias magnetic field, the detection circuit, and the like are the same as those in the example illustrated in FIG. 1.

In the arrangement of FIG. 15, the change in the arrangement of the magnetic sensor elements 8a to 8d allows for a shorter length L of the substrate 7 than that in the arrangement of FIG. 1. This allows for the reduction in the size of the current sensor. This facilitates the current measurement at a place where the installation space for the current sensor is narrow such as the inside of a distribution panel.

Figure 16:
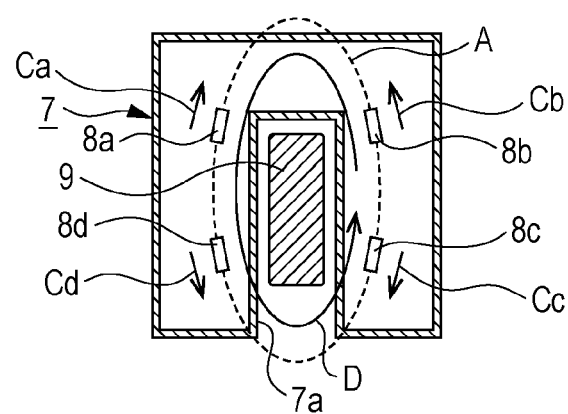
FIG. 16 is a schematic diagram illustrating an arrangement of another example of one embodiment of the present disclosure.
Figure 17:
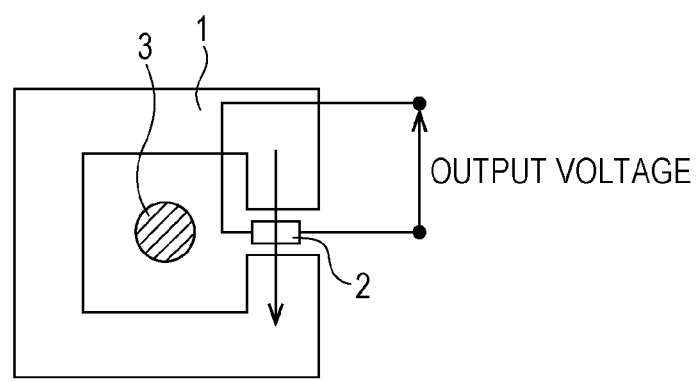
FIG. 17 is a schematic diagram illustrating an arrangement of an example of a conventional current sensor with a magnetism collection core.

FIG. 16 is also a schematic diagram illustrating the arrangement of another example according to one embodiment of the present disclosure. In this example, the cable 9 is a bus bar having a square cross section. As illustrated in FIG. 16, the substrate 7 is installed so that its substrate surface is parallel to the plane orthogonal to the measured current. On the substrate 7, four magnetic sensor elements 8a to 8d are arranged on the circumference of an ellipse surrounding the cable 9 in which the measured current flows. The magnetic sensor elements 8a to 8d are arranged so that their magnetic sensitive directions are directed to the tangent of the ellipse and that the magnetic sensor elements 8a to 8d are located at each vertex of a rectangle inscribing the ellipse. The directions of the bias magnetic fields applied to the magnetic sensor elements 8a to 8d neighboring to each other along the circumference of the ellipse are opposite to each other along the circumference of the ellipse. It is noted that the application of the bias magnetic field and the detection circuit in this example are the same as those in the example illustrated in FIG. 1.

With respect to the measurement of the current flowing in the bus bar, the magnetic field generated by the current represents an ellipse. Therefore, as illustrated in FIG. 1, the magnetic sensitive directions do not substantially contact to the direction of the generated magnetic field in the state where the magnetic sensor elements 8a to 8d are arranged in a circle, so that the sensitivity of the current detection decreases. Then, the elliptical arrangement of the magnetic sensor elements 8a to 8d as illustrated in FIG. 16 allows for a high sensitivity in the measurement of the magnetic field generated from the bus bar.

As described above, one embodiment of the present disclosure allows for the implementation of the current sensor using the magnetic sensor elements that consumes less power, has a high sensitivity property, has a compact and simple arrangement, is able to reduce a displacement-caused error, and is relatively inexpensive.

As described above, one embodiment of the present disclosure is directed to the high-sensitivity current sensor that is able to detect the magnitude of the current flowing in the cable in a contactless manner and reduce the measurement error even when the relative position of the current sensor and the cable changes. It is noted that the cable in one embodiment of the present disclosure includes the one having the sectional shape other than the circle such as a bus bar.

Further, the current sensor according to one embodiment of the present disclosure may be the following first to fourth current sensors. The first current sensor is a current sensor with a magnetic sensor element that converts a magnitude of a magnetic field into an electrical signal and outputs the electrical signal, and includes a bridge circuit formed with four magnetic sensor elements whose magnetic characteristics curve is axially symmetry, and a bias magnetic field application unit adapted to apply a bias magnetic field to each of the magnetic sensor elements, in which the magnetic sensor elements are arranged in a plane orthogonal to the measured current.

In the second current sensor, the magnetic sensor element is a magneto-resistance element, electric resistance of which changes in response to application of a magnetic field or a magneto-impedance element, electric impedance of which changes in response to application of a magnetic field in the first current sensor.

In the third current sensor, the bias magnetic field application unit includes at least a permanent magnet in the first or second current sensor.

In the fourth current sensor, the magnetic sensor elements are mounted on the sensor substrate made of a non-magnetic material in any one of the first to third current sensors.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A current sensor, comprising:
    four magnetic sensor elements arranged within a plane orthogonal to a measured current, having a symmetrical magnetic characteristics curve, and adapted to convert a magnitude of a magnetic field into an electrical signal and output the electrical signal;
    a bridge circuit including the four magnetic sensor elements; and
    a bias magnetic field application member adapted to applying a bias magnetic field to the magnetic sensor elements,
    wherein
    each of the magnetic sensor elements has a corresponding magnetic sensitive direction exhibiting a maximum sensitivity, and
    the magnetic sensitive directions of the magnetic sensor elements are four different directions arranged in the plane orthogonal to the measured current.

2. The current sensor according to claim 1, wherein the magnetic sensor elements are magneto-resistance elements electric resistances of which change in response to application of a magnetic field.

3. The current sensor according to claim 1, wherein the magnetic sensor elements are magneto-impedance elements electric impedances of which change in response to application of a magnetic field.

4. The current sensor according to claim 1, wherein the bias magnetic field application member includes a permanent magnet.

5. The current sensor according to claim 1, further comprising:
    a sensor substrate made of a non-magnetic material on which the magnetic sensor elements are mounted.

6. The current sensor according to claim 5, wherein the magnetic sensor elements are mounted on one surface of the sensor substrate and the bias magnetic field application member is arranged on the other surface of the sensor substrate.

7. The current sensor according to claim 6, further comprising:
    an attachment member made of a magnetic material and attaching the bias magnetic field application member to the sensor substrate.

8. The current sensor according to claim 1, wherein a magnetic pole direction of the bias magnetic field application member is parallel to the plane in which the magnetic sensitive directions of the magnetic sensor elements are arranged.

9. The current sensor according to claim 1, wherein the bridge circuit is arranged so that a cable in which the measured current flows is located therein.

10. The current sensor according to claim 1, further comprising:
    a cable in which the measured current flows,
    wherein
    the four magnetic sensor elements are arranged on a circumference of a circle centering around the cable,
    the magnetic sensitive direction of each of the magnetic sensor elements is in a tangent to the circle, and
    the four magnetic sensor elements are located at each vertex of a square inscribed in the circle.

11. The current sensor according to claim 10, wherein directions in which the bias magnetic field is applied to the magnetic sensor elements neighboring to each other are opposite to each other along the circumference of the circle.

12. A current sensor, comprising:

four magnetic sensor elements arranged within a plane orthogonal to a measured current, having a symmetrical magnetic characteristic curve, and adapted to convert a magnitude of a magnetic field into an electrical signal and output the electrical signal;

a bridge circuit including the four magnetic sensor elements;

a bias magnetic field application member adapted to apply a bias magnetic field to the magnetic sensor elements; and a cable in which the measured current flows, wherein the bridge circuit is arranged so that the cable in which the measured current flows is located therein, the four magnetic sensor elements are arranged on a circumference of an ellipse centering around the cable, a magnetic sensitive direction exhibiting a maximum sensitivity of each of the magnetic sensor elements is in a tangent to the ellipse, the four magnetic sensor elements are located at each vertex of a rectangle inscribed in the ellipse, and directions in which the bias magnetic field is applied to the magnetic sensor elements neighboring to each other are opposite to each other along the circumference of the ellipse.

13. A current sensor, comprising:

four magnetic sensor elements arranged within a plane orthogonal to a measured current, having a symmetrical magnetic characteristic curve, and adapted to convert a magnitude of a magnetic field into an electrical signal and output the electrical signal;

a bridge circuit including the four magnetic sensor elements;

a bias magnetic field application member adapted to apply a bias magnetic field to the magnetic sensor elements; and a cable in which the measured current flows, wherein the bridge circuit is arranged so that the cable in which the measured current flows is located therein, the four magnetic sensor elements are arranged on a circumference of a circle centering around the cable, a magnetic sensitive direction exhibiting a maximum sensitivity of each of the magnetic sensor elements is in a tangent to the circle, the four magnetic sensor elements are located at each vertex of a rectangle inscribed in the circle, and directions in which the bias magnetic field is applied to the magnetic sensor elements neighboring to each other are opposite to each other along the circumference of the circle.

* * * * *